(12) United States Patent
Shoemaker et al.

(10) Patent No.: US 8,409,458 B2
(45) Date of Patent: Apr. 2, 2013

(54) PROCESS FOR REACTIVE ION ETCHING A LAYER OF DIAMOND LIKE CARBON

(75) Inventors: Erika Leigh Shoemaker, Richardson, TX (US); Maria Wang, Plano, TX (US); Mary Roby, Plano, TX (US); Stuart Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 426 days.

(21) Appl. No.: 11/681,483

(22) Filed: Mar. 2, 2007

(65) Prior Publication Data
US 2008/0214016 A1 Sep. 4, 2008

(51) Int. Cl.
*C03C 15/00* (2006.01)
(52) U.S. Cl. .................. 216/66; 216/74; 216/81
(58) Field of Classification Search ............ 216/66, 216/74, 81
See application file for complete search history.

(56) References Cited

U.S. PATENT DOCUMENTS

| | | | |
|---|---|---|---|
| 5,939,149 A * | 8/1999 | Jang et al. | 427/535 |
| 7,080,896 B2 | 7/2006 | Bell et al. | |
| 7,165,830 B2 | 1/2007 | Miller, Jr. | |
| 2003/0162407 A1 * | 8/2003 | Maex et al. | 438/725 |
| 2004/0227791 A1 * | 11/2004 | Anderson et al. | 347/63 |
| 2005/0230752 A1 * | 10/2005 | Kanno et al. | 257/347 |
| 2005/0287397 A1 * | 12/2005 | Soeno et al. | 428/831 |
| 2006/0044357 A1 * | 3/2006 | Anderson et al. | 347/63 |
| 2006/0079039 A1 | 4/2006 | Ohtani et al. | |
| 2006/0202615 A1 * | 9/2006 | Murakami et al. | 313/506 |
| 2006/0246640 A1 * | 11/2006 | Kuwashima et al. | 438/151 |
| 2006/0286292 A1 * | 12/2006 | Jiang et al. | 427/127 |
| 2006/0292705 A1 * | 12/2006 | Hegde et al. | 438/3 |
| 2007/0026580 A1 | 2/2007 | Fujii | |
| 2007/0069401 A1 * | 3/2007 | Kakehata | 257/E21.168 |
| 2007/0146436 A1 * | 6/2007 | Cornell et al. | 347/61 |

* cited by examiner

*Primary Examiner* — Binh X Tran
(74) *Attorney, Agent, or Firm* — Jacqueline J. Garner; Wade J. Brady, III; Frederick J. Telecky, Jr.

(57) ABSTRACT

Provided is a process for manufacturing a diamond like carbon layer. The process for manufacturing the diamond like carbon layer includes, without limitation, forming a layer of diamond like carbon over a substrate, and reactive ion etching the layer of diamond like carbon.

10 Claims, 3 Drawing Sheets

PROCESS FOR REACTIVE ION ETCHING A LAYER OF DIAMOND LIKE CARBON

TECHNICAL FIELD OF THE INVENTION

The disclosure is directed, in general, to a process for etching a layer of diamond like carbon and, more specifically, to a process for reactive ion etching a layer of diamond like carbon.

BACKGROUND OF THE INVENTION

In the production of thermal micro-fluid ejection devices such as ink jet printheads, a cavitation layer is typically provided as an ink contact layer for a heater resistor. The cavitation layer prevents damage to the underlying dielectric and resistive layers during ink ejection. Between the cavitation layer and heater resistor there are typically one or more layers of a passivation material to reduce ink corrosion of the heater resistor. In a typical printhead, tantalum (Ta) is used as the cavitation layer. The Ta layer is deposited on a dielectric layer such as silicon carbide (SiC) or a composite layer of SiC and silicon nitride (SiN).

One disadvantage of this multilayer thin film heater construction is that the cavitation and protective layers are less heat conductive than the underlying resistive layer. Accordingly, the use of these cavitation and protective layers increase the energy requirements for the printhead. Increased energy input to the heater resistors not only increases the overall printhead temperature, but also reduces the frequency of drop ejection, thereby decreasing the printing speed of the printer.

In response to the need to reduce the energy consumption (e.g., as discussed above), the industry has investigated different materials for its protective layers. One such material is diamond-like carbon, or in some instances doped diamond-like carbon. While diamond-like carbon has a conductivity value more near that of the underlying resistive layer, and thus addresses the energy requirements, it is often difficult to integrate into current process flows (e.g., whether it be in printheads or other semiconductor devices).

Accordingly, what is needed in the art is a method for incorporating diamond-like carbon into current process flows, whether related to micro-fluid ejection devices or not, that does not experience the drawbacks of previous processes.

SUMMARY OF THE INVENTION

To address the above-discussed deficiencies of the prior art, provided is a process for manufacturing a diamond like carbon layer. The process for manufacturing the diamond like carbon layer includes, without limitation, forming a layer of diamond like carbon over a substrate, and reactive ion etching the layer of diamond like carbon.

Further provided is a method for manufacturing a semiconductor device. The method for manufacturing the semiconductor device, among other steps, may include forming a transistor device over a substrate, the transistor device including a gate structure located over the substrate and source/drain regions located in or over the substrate. This method may further include forming a layer of diamond like carbon over the transistor device, and reactive ion etching the layer of diamond like carbon.

BRIEF DESCRIPTION OF THE DRAWINGS

For a more complete understanding of the disclosure, reference is now made to the following descriptions taken in conjunction with the accompanying drawings, in which.

DETAILED DESCRIPTION

The disclosure is based, at least in part, on the acknowledgement that conventional processes for etching diamond like carbon are insufficient in many of today's applications that make use of diamond like carbon. For example, the disclosure acknowledges that conventional etching processes tend to have issues when etching thicker diamond like carbon layers. Based upon this acknowledgment, as well as substantial experimentation, the disclosure recognizes that etching the diamond like carbon layers using a reactive ion etch reduces, or substantially eliminates, the issues associated with the conventional processes. Accordingly, in one embodiment the reactive ion etching of the diamond like carbon layers allows the diamond like carbon layers to be selectively etched, at least as compared to the surrounding films (e.g., metals and oxides).

FIGS. 1-6 illustrate views showing one embodiment of a method for manufacturing an ink jet printhead. The embodiment illustrated in FIGS. 1-6, however, shows but one use for diamond like carbon. For instance, diamond like carbon could also be used as a protective overlay or final passivation layer. Additionally, the diamond like carbon could be used as a hardmask or etch stop layer in a semiconductor process flow. Moreover, the diamond like carbon could be used as an inter-level dielectric, for example in place of Silox, TEOS, BPSG, etc. Inter-level dielectric, as used within this disclosure, means any dielectric separating different levels of a semiconductor device, including active device level and the first metal level, as well as different metal levels. Therefore, the reactive ion etching of the diamond like carbon, as provided in this disclosure, could be used in any of the above applications, among others.

Figure 1:
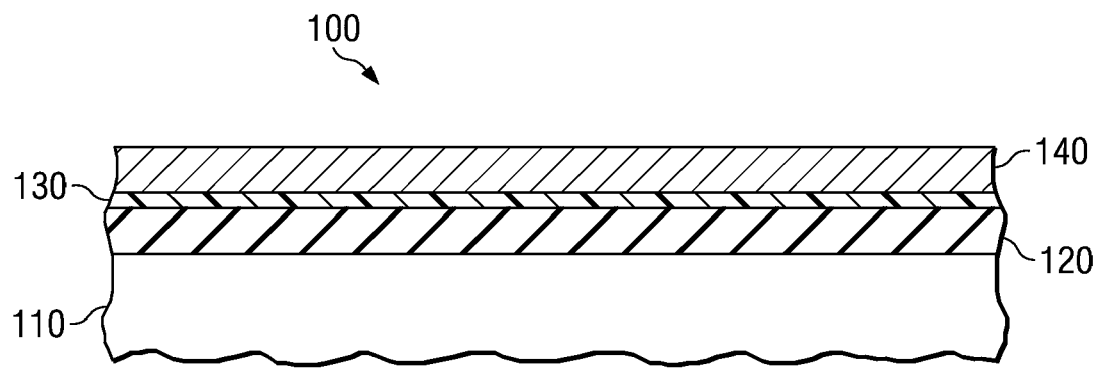
FIGS. 1-6 illustrate one embodiment of a process for manufacturing an inkjet printhead.

FIG. 1 begins with an inkjet printhead 100 at an initial stage of manufacture. The printhead 100 of FIG. 1 includes a substrate 110. The substrate may comprise many different materials. In one embodiment, however, the substrate 110 comprises a silicon substrate or other similar base substrate material.

Located over the substrate 110 is an insulative layer 120. As will be more apparent below, the insulative layer 120 electrically insulates subsequently formed layers from the substrate 110. In one embodiment, the insulative layer 120 comprises silicon dioxide. Nevertheless, other insulative materials might be used for the insulative layer 120. The insulative layer 120 may have a variety of thicknesses; however, in one embodiment a thickness of the insulative layer 120 ranges from about 500 nm to about 1000 nm.

Located over the insulative layer 120 is a resistive layer 130. The resistive layer 130, like the layers previously discussed, may comprise many different types of resistive material. Nevertheless, in one embodiment the resistive layer 130 comprises TaAl. However, the resistive layer 130 may also comprise $Ta_2N$, TaAl(O,N), TaAlSi, TaSiC, Ti(N,O), WSi(O, N), TaAlN and TaAl/Ta, among others. The resistive layer 130 may also have a variety of thicknesses. In one embodiment a thickness of the resistive layer 130 ranges from about 10 nm to about 200 nm.

Located over the resistive layer 130 is a conductive spacer layer 140. The spacer layer 140, in the illustrated embodiment, is a metal spacer layer. For instance, the spacer layer 140 might comprise AlCu, among others, and remain within the purview of the disclosure. The spacer layer 140 may additionally have a variety of thicknesses. In one embodiment a thickness of the spacer layer 140 ranges from about 200 nm to about 1500 nm.

Those skilled in the art understand the processes that might be used to form the layers 120, 130 and 140 on the substrate 110. For example, in one embodiment conventional microelectronic fabrication processes such as physical vapor deposition (PVD), chemical vapor deposition (CVD), or sputtering may be used to provide the various layers on the substrate 110. In other embodiment non-conventional microelectronic fabrication processes could be used. Accordingly, the present disclosure should not be limited to any specific process for forming layers 120, 130 and 140.

Figure 2:
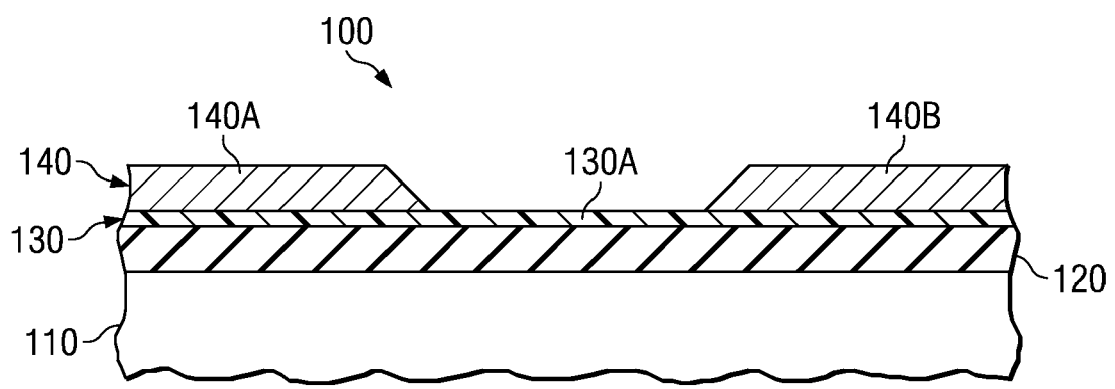

FIG. 2 illustrates the printhead 100 of FIG. 1 after etching the conductive spacer layer 140. In this embodiment, the conductive spacer layer 140 is etched to provide ground and power conductors 140A and 140B and to define the heater resistor 130A. The conductive spacer layer 140 may be etched using many different processes, conventional and not. Accordingly, the etching of the conductive spacer layer 140 should not be limited to any specific etching process or conditions.

Figure 3:
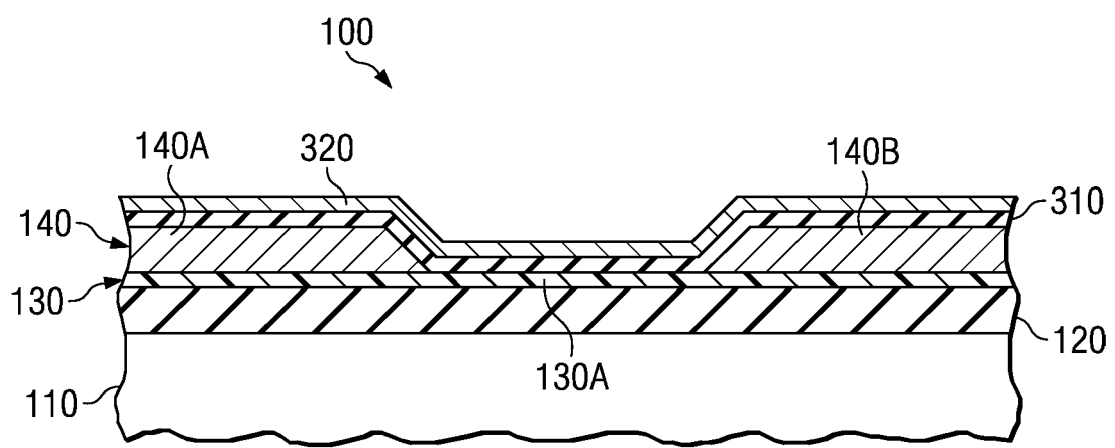

FIG. 3 illustrates the printhead 100 of FIG. 2 after forming a layer of diamond like carbon 310 over the substrate 110 and an optional cavitation layer 320 over the layer of diamond like carbon 310. The layer of diamond like carbon 310, in the illustrated embodiment, is configured to protect the heater resistor 130A from corrosion and erosion, among other purposes. The layer of diamond like carbon 310, in contrast to many previous uses of the material, may have a thickness of greater than about 30 nm. For instance, the layer of diamond like carbon 310, in one embodiment, may have a thickness ranging from about 50 nm to about 800 nm, among others.

The layer of diamond like carbon 310, in one embodiment, comprises a titanium-doped diamond like carbon layer. In an alternative embodiment, the layer of diamond like carbon 310 comprises a single thin film diamond like carbon layer having at least a first surface comprised of more than about 30 atom % titanium. In other alternative embodiments, the layer of diamond like carbon 310 comprises multiple doped-diamond like carbon layers. For instance, the layer of diamond like carbon 310 might comprise a first substantially uniformly Si-doped diamond like carbon layer and a second Ti-doped diamond like carbon layer overlying the first Si-doped diamond like carbon layer.

In those embodiments wherein a Ti-doped diamond like carbon layer is used, the titanium may be uniformly doped, non-uniformly doped, or even have a low concentration of titanium adjacent one surface and a high concentration of titanium adjacent an opposing surface. For instance, the Ti-doped diamond like carbon layer may include from about 5 to about 15 atom % titanium substantially uniformly distributed there through. Alternatively, a first surface adjacent the heater resistor 130A may include a titanium concentration ranging from about 5 to about 15 atom % and the opposing surface may include a titanium concentration ranging from about 80 to about 95 atom %, or more. In such a case, interior portions between the opposing surfaces may have a titanium concentration of 95 atom % or more. Alternatively, the Ti-doped diamond like carbon layer may have a step-wise increase in titanium from a first surface adjacent the heater resistor 130A to a second opposing surface.

Those skilled in the art understand the myriad of different processes that might be used to form the diamond like carbon layer 310. For example, in order to provide a Ti-doped diamond like carbon layer as described above, a plasma enhanced chemical vapor deposition (PE-CVD) reactor may be supplied with a precursor gas providing a source of carbon such as methane, ethane, or other simple hydrocarbon gas and from a vapor derived from an organometallic compound. Such compounds include, but are not limited to, bis(cyclopentadienyl)bis(dimethyl-amino)titanium, tert-Butyltris (dimethylamino)titanium, tetrakis(diethylamino)titanium, tetrakis(ethylmethylamino)titaniu, tetrakis(isopropylmethylamino)titanium, and the like. A preferred organometallic compound is tetrakis(dimethylamino)titanium.

During the deposition process for the Ti-doped diamond like carbon layer, at least in this embodiment, the gasses in the reactor may be disassociated to provide reactive ions that are incorporated into a growing film. During film growth, a radio frequency (RF) bias may be applied to the substrate surface to promote retention of only strong diamond like carbon bonds. By adjusting the ratio of the feed gases, the ratios of the titanium to diamond like carbon in the growing film can be adjusted from about 0 atom % to about 100 atom %.

One specific embodiment for forming a titanium-doped diamond like carbon layer, is as follows: A titanium-doped diamond like carbon layer is formed on a substrate in a conventional plasma enhanced chemical vapor deposition (PECVD) chamber with about a 100 to about 1000 volt bias between the substrate and a gas plasma at an RF frequency of about 13.6 Khz. During deposition, the substrate is maintained at room temperature of about 25° C. The gas plasma in the chambers may include vaporized methane and tetrakis (dimethylamino)titanium in helium gas (TDMAT/He). When a portion of the cavitation layer to be deposited is an undoped diamond-like carbon layer, the flow of TDMAT/He gas to the chamber is shut off thereby allowing a pure diamond like carbon layer to plate out or build up on the substrate. When a portion of the cavitation layer is to be essentially pure titanium, the methane gas to the chamber is shut off thereby allowing pure titanium to plate or build up or plate out on the substrate. Adjusting the ratio of TDMAT/He to methane in the plasma gas during the deposition process as described herein may make various ranges of titanium concentration in the diamond like carbon layer. The titanium-doped diamond like carbon layer may be deposited at a pressure of about 10 mT to about 1 Torr using a substrate power of about 100 to about 1000 Watts with a methane flow rate ranging from about 10 to about 100 standard cubic centimeters per minute (sccm) and a TDMAT flow rate ranging from about 1 to about 100 sccm. During the deposition process, it may be desirable to provide a nitrogen carrier gas to the chamber with the TDMAT/He gas to control the gas pressure during deposition.

As indicated above, a cavitation layer 320 may be located over the layer of diamond like carbon 310. The term cavitation layer, as used throughout this disclosure, means a mechanical and/or electrical isolation layer between the resistive layer and the environment. The cavitation layer 320 may also comprise many different materials. For example, without limitation, the cavitation layer 320 may comprise tantalum, titanium or another similar metal. The cavitation layer 320 may also comprise many different thicknesses. Nevertheless, in one embodiment the cavitation layer 320 has a thickness ranging from about 100 nm to about 500 nm, among others. Those skilled in the art understand the processes that might be used to form the cavitation layer 320, including sputter depositing the cavitation layer 320 in one embodiment.

It should be noted that certain embodiments may exist wherein no cavitation layer 320 is needed. For example, certain embodiments exist wherein the layer of diamond like carbon 310, alone, is sufficient to provide the requisite mechanical and/or electrical isolation for the printhead 100.

Accordingly, in this embodiment the layer of diamond like carbon 310 would effectively function as the cavitation layer, and thus no independent cavitation layer 320 would be required. The layer of diamond like carbon 310 would also, in this embodiment, function as a passivation layer.

Figure 4:
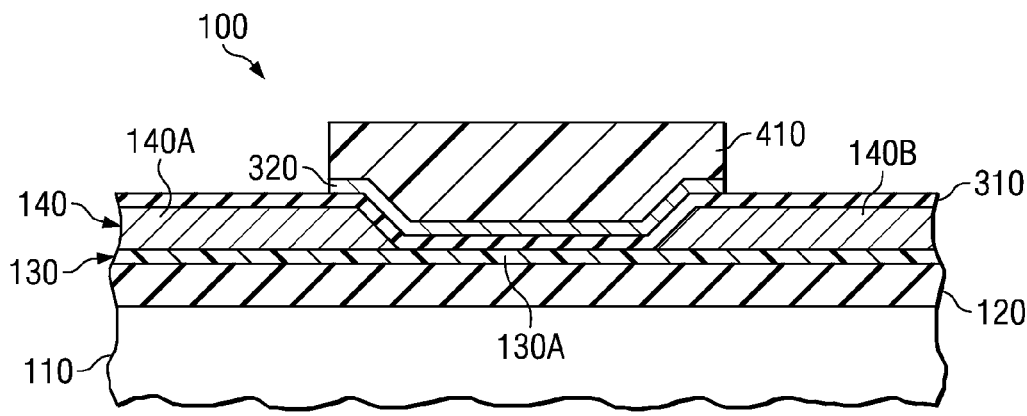

FIG. 4 illustrates the printhead 100 of FIG. 3 after patterning a layer of resist 410 over the substrate 110 and thereafter using the patterned layer of resist 410 to etch the cavitation layer 320. The process for patterning the layer of resist 410, in one embodiment, may be a conventional process. For instance, the process for patterning the resist 410 may include the application of a layer of resist material to a substrate (e.g., the cavitation layer 320 in this embodiment), followed by the selective exposure of the resist layer to an energy source, wherein portions of the resist layer are changed in character due to their exposure to the energy source. After such exposure, the resist layer is then developed by a "wet development process" (e.g., employing liquid chemical solvents to selectively remove portions of the resist) to provide the desired pattern therein.

The cavitation layer 320 may be etched using many different techniques and/or etchants. In one embodiment, however, the cavitation layer 320 is etched using a wet or dry reactive ion etching (e.g., plasma) etch process. Furthermore, those skilled in the art understand the etching parameters that might be used.

Figure 5:
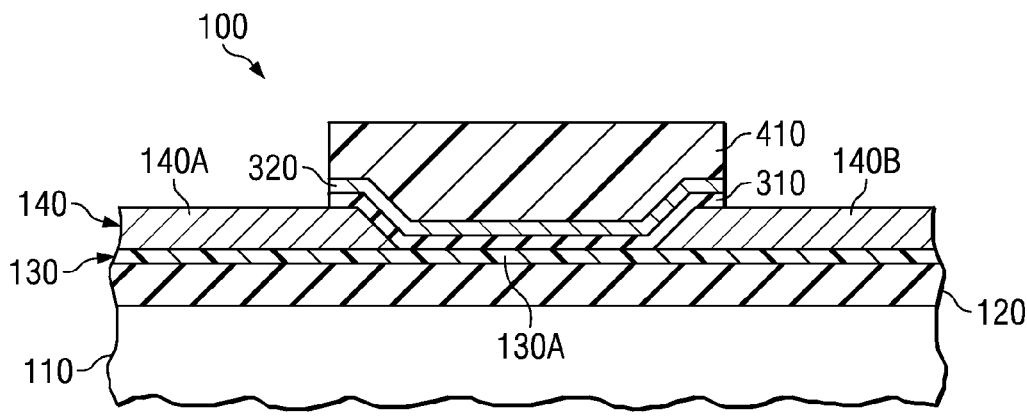

FIG. 5 illustrates the printhead 100 of FIG. 4 after etching the layer of diamond like carbon 310. The layer of diamond like carbon 310, in the disclosed embodiments, is etched using a reactive ion etching procedure with the resist 410 acting as a mask. Reactive ion etching, as used throughout this disclosure, refers to chemical and/or physical removal of atoms via a charged plasma. The reactive ion etch, in one embodiment, uses $SF_6$ and a carrier gas. For instance, a ratio of $SF_6$ to carrier gas (e.g., He, Ar, $N_2$, etc.) ranging from about 1:1 to about 1:10 could be used for the reactive ion etch. In those embodiments wherein such ratios are used, the $SF_6$ flow rate might range from about 10 sccm to about 500 sccm and the flow rate of the carrier gas might range from about 10 sccm to about 500 sccm. The reactive ion etch might further use a pressure ranging from about 10 mT to about 2000 mT, among others. Additionally, wherein a single plasma source is used the power might range from about 100 Watts to about 1000 Watts. Moreover, wherein a dual plasma source is being used the source might operate at a power ranging from about 100 Watts to about 500 Watts and the bias at a power ranging from about 10 Watts to about 500 Watts. In addition to those process conditions described, the cathode temperature might range from about −5° C. to about 100° C., among others.

The disclosed processing conditions for the reactive ion etch provide superior results. For example, the disclosed processing conditions allow the etch of the layer of diamond like carbon 310 to be selective thereto. Accordingly, the reactive ion etch removes the layer of diamond like carbon 310 without substantially affecting other layers it may come into contact with. In those embodiment wherein the reactive ion etch may contact an oxide, the etch has a selectivity (e.g., diamond like carbon layer to the oxide) between about 1:1 and about 10:1, depending on chemistry. In those embodiment wherein the reactive ion etch may contact a metal, the etch has a selectivity (e.g., diamond like carbon layer to the metal) of about 100:1 or better. Because of these etch selectivities (e.g., created by the reactive ion etch), the layer of diamond like carbon can be used in circumstances where it previously could not. Accordingly, the layer of diamond like carbon may now be used in situations requiring greater thicknesses.

Figure 6:
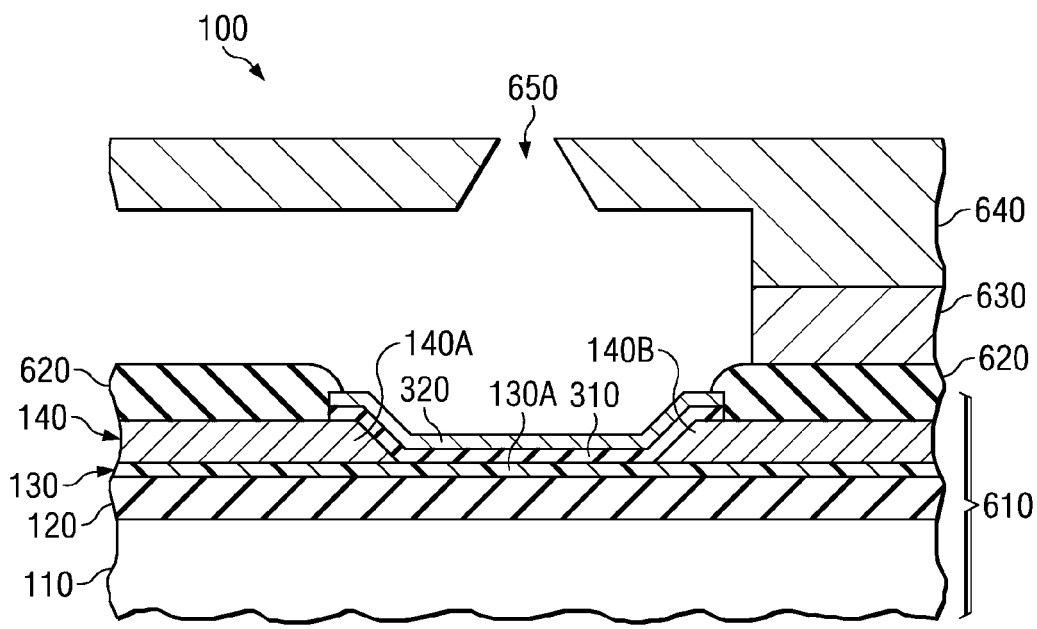

FIG. 6 illustrates the printhead 100 of FIG. 5 after forming an insulative layer 620 on exposed portions of the spacer layer 140, and in this embodiment over a heater chip 610 portion of the printhead 100. The insulative layer 620 may again comprise silicon dioxide or another similar material, and may additionally overlap the patterned diamond like carbon layer 310 and cavitation layer 320. Any suitable manufacturing process might be used to deposit and pattern the insulative layer 620.

FIG. 6 further illustrates that another conductive layer 630 may be formed in contact with the insulative layer 620. The conductive layer 630, in one embodiment, is in contact with the spacer layer 140. The conductive layer 630 may comprise any suitable conductive material (e.g., AlCu) and thickness. Additionally, the conductive layer 630 may be formed using any suitable manufacturing process.

FIG. 6 additionally illustrates that a nozzle plate 640 having one or more openings 650 therein may be attached to the heater chip 610. The nozzle plate 640 may be attached to the conductive layer 630 using, among others, an adhesive. Those skilled in the art understand the process of attaching the nozzle plate 640 to the heater chip 610.

Figure 7:
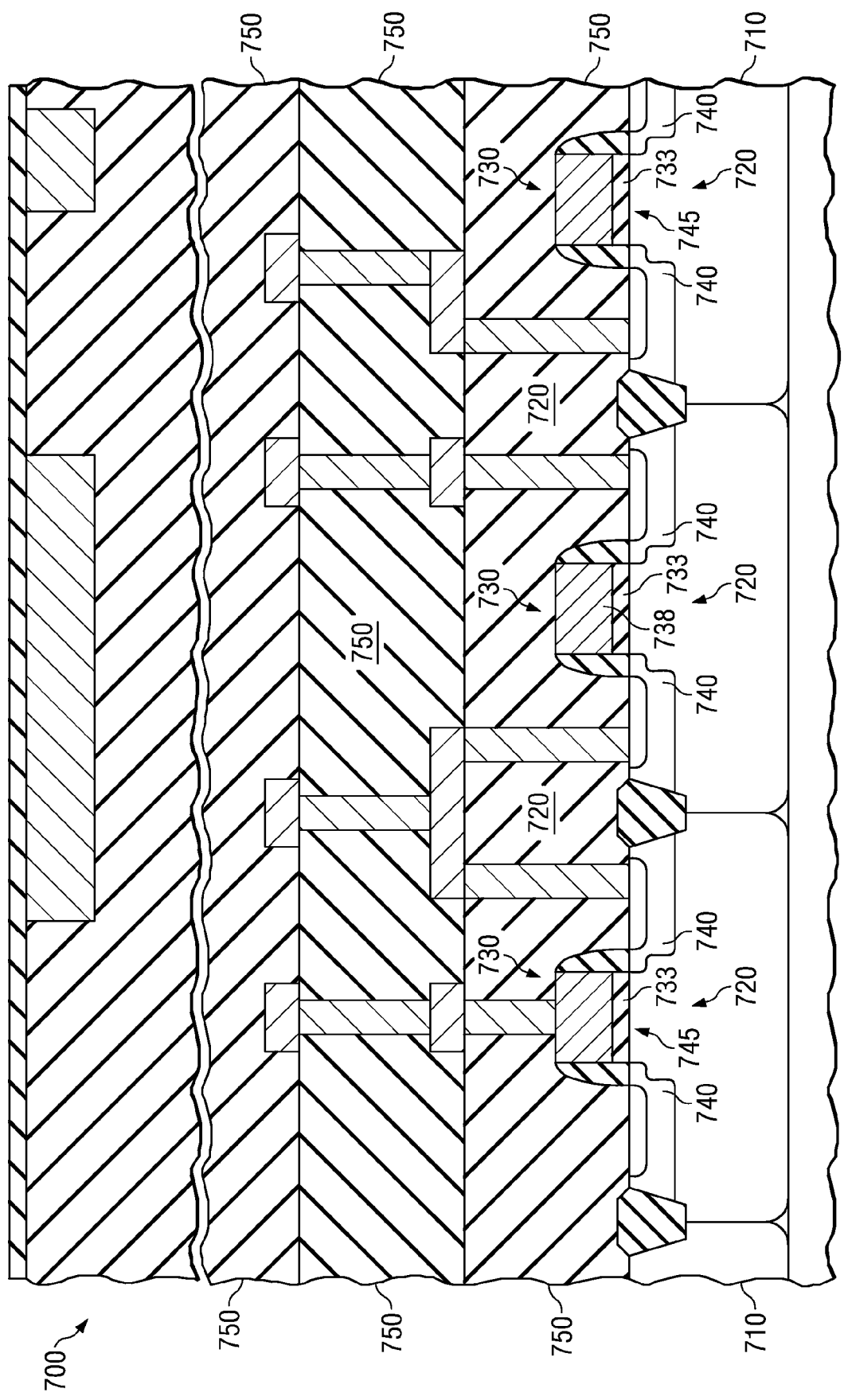
FIG. 7 illustrates an embodiment of a semiconductor device manufactured according to the disclosure.

FIG. 7 illustrates an alternative embodiment of the disclosure. For instance, FIG. 7 illustrates a semiconductor device 700 including a layer of diamond like carbon. The semiconductor device 700 includes a transistor device 720 located over a substrate 710. The transistor device 720 in this embodiment includes a gate structure 730, including a gate dielectric 733 and gate electrode 738, and source/drain regions 740 defining a channel region 745.

Positioned over the transistor device 720 are one or more inter-level dielectric layers 750. In the embodiment of FIG. 7, at least one of the one or more inter-level dielectric layers 750 comprise the layer of diamond like carbon. Additionally, the layer of diamond like carbon, for example because of its significant thickness, may be etched using the disclosed reactive ion etching process.

While one or more of the inter-level dielectric layers 750 of FIG. 7 may comprise the layer of diamond like carbon, as well as may be etched using the disclosed reactive ion etching process, other features of the semiconductor device 700 may additionally comprise the layer of diamond like carbon and be etched using the disclosed reactive ion etching process. For example, any hardmask or etch stop layer used in the manufacture of the semiconductor device 700 may comprise the layer of diamond like carbon and be etched using the disclosed reactive ion etching process. Additionally, protective overlays or final passivation layers of the semiconductor device 700 (neither of which are clearly illustrated in FIG. 7) may comprise the layer of diamond like carbon and be etched using the disclosed reactive ion etching process. Other uses for the layer of diamond like carbon, and related etch, are also envisioned.

It should be noted that the disclosure is not limited to the specific ink cartridge described above, as the printhead described herein may be used in a wide variety of fluid ejection devices, including but not limited to, ink jet printers, micro-fluid coolers, pharmaceutical delivery systems, and the like.

Those skilled in the art to which the disclosure relates will appreciate that other and further additions, deletions, substitutions and modifications may be made to the described embodiments without departing from the scope herein.

What is claimed is:

1. A method of manufacturing a semiconductor device, comprising:

forming a metal or oxide layer over a semiconductor substrate;

forming a layer of silicon-doped diamond like carbon (Si-DLC) material of thickness greater than 50 nm on the metal or oxide layer; and patterning the layer of silicon-doped diamond like carbon material by selectively etching in a reactive ion etching process using $SF_6$.

2. The method of claim 1, wherein the semiconductor device is an ink jet printhead.

3. The method of claim 2, further comprising forming an insulative layer over the semiconductor substrate; and forming a resistive layer over the insulative layer; wherein forming the metal or oxide layer comprises forming a metal spacer layer over the resistive layer, and patterning the metal spacer layer by selective etching to expose a heater defining portion of the resistive layer surrounded by ground and power conductor defining remaining portions of the metal spacer layer; and wherein the layer of silicon-doped diamond like carbon is formed over the patterned metal spacer layer.

4. The method of claim 3, wherein patterning the layer of silicon-doped diamond like carbon material removes portions of the silicon-doped diamond like carbon material over the ground and power conductors and distant from the heater, leaving at least a portion of the silicon-doped diamond like carbon material over the heater.

5. The method of claim 4, further comprising forming a second insulative layer over remaining portions of the metal spacer layer at locations of removed portions of the silicon-doped diamond like material; forming a conductive layer over the second insulative layer and in contact with the metal spacer layer; and providing a nozzle plate attached to the conductive layer including a nozzle opening over the heater.

6. The method of claim 3, further comprising forming a cavitation layer over the layer of silicon-doped diamond like carbon; and patterning the cavitation layer by selectively etching in a reactive ion etching process.

7. The method of claim 6, wherein the insulative layer comprises silicon dioxide; the resistive layer comprises TaAl; the metal spacer layer comprises AlCu; and the cavitation layer comprises tantalum or titanium.

8. The method of claim 7, wherein the insulative layer has a thickness of 500 to 1000 nm; the resistive layer has a thickness of 10 to 200 nm; the metal spacer layer has a thickness of 200 to 1500 nm; and the cavitation layer has a thickness of 100 to 500 nm.

9. The method of claim 3, wherein the insulative layer comprises silicon dioxide; the resistive layer comprises TaAl; and the metal spacer layer comprises AlCu.

10. The method of claim 9, wherein the insulative layer has a thickness of 500 to 1000 nm; the resistive layer has a thickness of 10 to 200 nm; and the metal spacer layer has a thickness of 200 to 1500 nm.

* * * * *